US011626720B1

(12) United States Patent
Nguyen et al.

(10) Patent No.: US 11,626,720 B1
(45) Date of Patent: Apr. 11, 2023

(54) MULTIPHASE GROUND FAULT CIRCUIT INTERRUPTER

(71) Applicant: Neilsen-Kuljian, Inc., San Jose, CA (US)

(72) Inventors: Huy D. Nguyen, Tracy, CA (US); Tom Lik-Chung Lee, San Jose, CA (US)

(73) Assignee: NEILSEN-KULJIAN, INC., San Jose, CA (US)

( * ) Notice: Subject to any disclaimer, the term of this patent is extended or adjusted under 35 U.S.C. 154(b) by 0 days.

(21) Appl. No.: 17/749,743

(22) Filed: May 20, 2022

(51) Int. Cl.
*H02H 3/34* (2006.01)
*H02H 3/10* (2006.01)
*G01R 31/08* (2020.01)
*H02H 7/26* (2006.01)

(52) U.S. Cl.
CPC .............. *H02H 3/34* (2013.01); *G01R 31/08* (2013.01); *H02H 3/105* (2013.01); *H02H 7/26* (2013.01)

(58) Field of Classification Search
CPC ........... H02H 3/34; H02H 3/105; G01R 31/08
See application file for complete search history.

(56) References Cited

U.S. PATENT DOCUMENTS

| 9,664,709 | B2 * | 5/2017 | Nguyen | G01R 15/125 |
| 10,790,659 | B1 * | 9/2020 | Lee | H02H 7/08 |
| 11,022,655 | B2 * | 6/2021 | Liu | H02H 7/26 |
| 2008/0106269 | A1 * | 5/2008 | Lewinski | H02H 3/335 |
| | | | | 324/509 |
| 2008/0123227 | A1 * | 5/2008 | Bonasia | H02H 3/338 |
| | | | | 361/49 |
| 2011/0216451 | A1 * | 9/2011 | Haines | H02H 3/338 |
| | | | | 361/93.6 |
| 2013/0057990 | A1 * | 3/2013 | Finlay, Sr | H02H 3/338 |
| | | | | 361/50 |
| 2015/0194798 | A1 * | 7/2015 | Ward | H02H 3/165 |
| | | | | 361/49 |
| 2020/0241050 | A1 * | 7/2020 | Camacho | G01R 15/202 |

FOREIGN PATENT DOCUMENTS

CN          206135427     *  4/2017

OTHER PUBLICATIONS

English translation of CN206135427 Liu Kai "A Load Transfer Terminal Device Based On Transient Waveform Fitting" (Year: 2017).*
North Shore Safety, LineGard 60 Amp 3-phase GFCI, Installation and Testing Procedure, downloaded Mar. 16, 2022.
Littlefuse, Shock Block SB5000 Series Special Purpose Ground-Fault Circuit Interrupter, Rev. Feb. 9, 2022.
Hongfa, XMC0 Series Definite Purpose Contactors, downloaded Apr. 8, 2022.

* cited by examiner

*Primary Examiner* — Sisay G Tiku
(74) *Attorney, Agent, or Firm* — TIPS Group

(57) ABSTRACT

A multiphase ground fault circuit interrupter includes a first phase power line input, a second phase power line input, a third phase power line input, a neutral line input, a controller circuit having a relay control output, a first phase latching relay having a first phase switch input coupled to the first phase power line input and a first phase relay control input coupled to the relay control output of the controller circuit, a sensor having a core and a sensor pickup coupled to the controller circuit, and a first phase load wire coupled to a first phase switch output of the first phase latching relay and passed through the core.

16 Claims, 4 Drawing Sheets

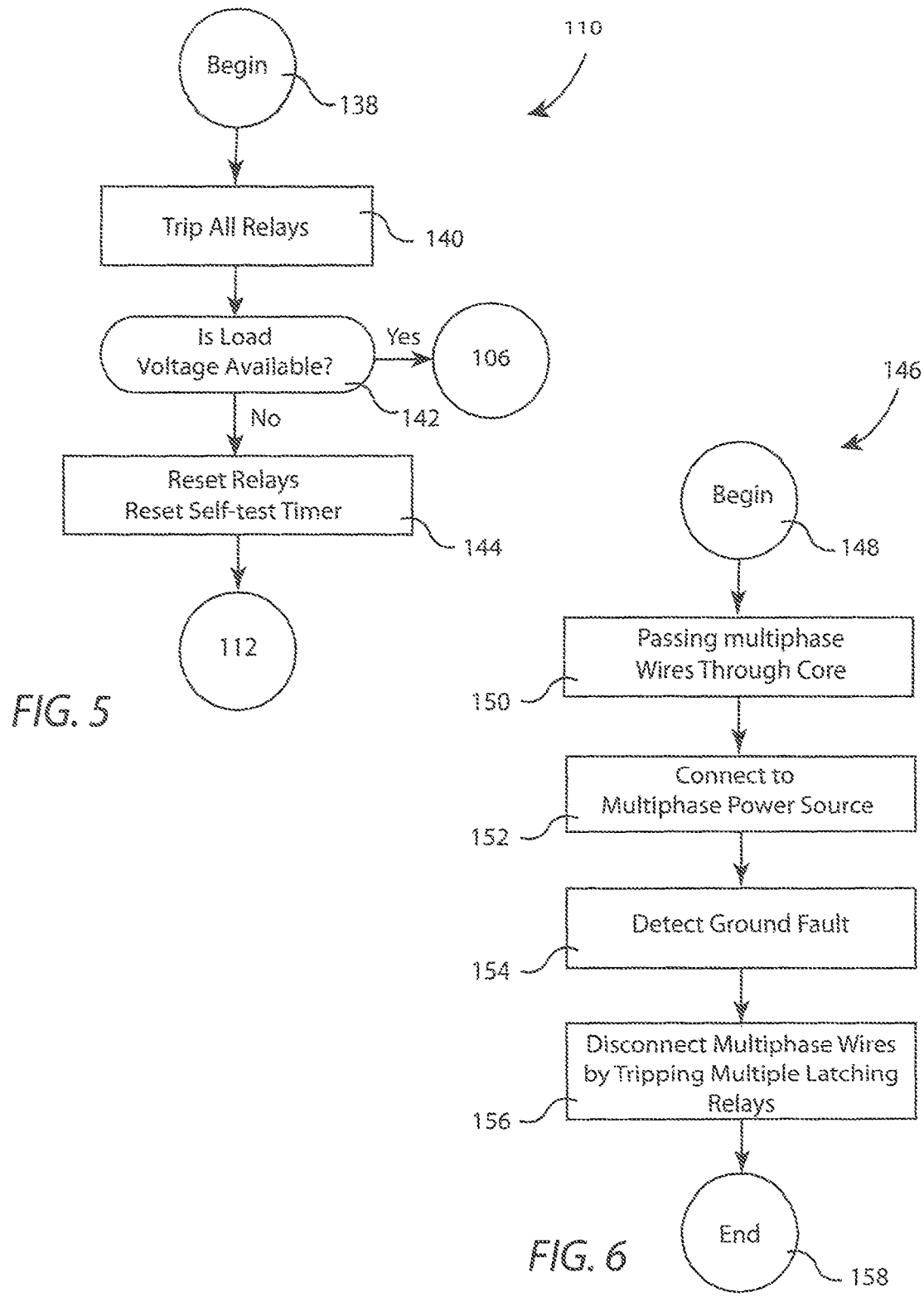

MULTIPHASE GROUND FAULT CIRCUIT INTERRUPTER

BACKGROUND

The National Electrical Code (NEC) requires ground fault circuit interrupter (GFCI) protection for certain locations. Commercially available GFCIs usually come in two varieties. One is the common alternating current (AC) receptacle GFCI found in kitchens and garages. These are normally rated 15 amperes (A) at 120 volts AC (VAC) and provide protection to specific areas at the receptacle. The other is the GFCI circuit breaker found in electrical panels. These can be single-pole or double-pole and are rated up to 50 A at 240 VAC to provide protection for the branch circuit downstream from the breaker.

Recent changes to the NEC will require GFCI protection in certain commercial areas that can be considered wet locations, and which may involve loads that are beyond the ratings of GFICs shown above. One example is commercial kitchens where heating loads will require three phase power and amperage of 60 A and above. Three phase power supplies comprise one type of multiphase power phase power supply and include three power lines having AC phases that are 120 degrees apart and a neutral line that is common to all three phases.

North Shore Safety, a Tecmark Company, of Mentor. Ohio sells a three phase ground fault circuit interrupter under the trademark "LineGard." Upon the detection of a ground fault, the LineGard triggers a "contactor" which disconnects the three phase power lines from the load. A similar device is made by Littlefuse of Chicago, Ill. under the trademark "Shock Block." Neither of these devices are capable of disconnecting the neutral line from the load.

Contactors are often used as power switches for high-power multiphase systems such as HVAC, refrigeration, heating, and commercial kitchens. When tripped, they open a triple pole, single throw switch to disconnect the load from the power lines. Contactors do not disconnect the neutral line from the load.

Contactors are heavy-duty, high performance switches and tend to be relatively expensive. Furthermore, once tripped, contactors require power in order to remain open. Examples of commercially available contactors are the XMC0 series of "Definite Purpose Contactors" sold by Hongfa of Xiamen, China.

When contactors are used in GFCI of the prior art, power must remain available for the GFCI to both power its control circuitry and the contactor, even after a ground fault is detected. This not only consumes energy, but it also leads to potential inadvertent opening of the contactors switches in the event of a power failure. Even more dangerous is a "brown-out" situation, where there is insufficient voltage available to keep the contactor switches open even though there is a ground fault detected, creating a potential hazard.

These and other limitations of the prior art will become apparent to those of skill in the art upon a reading of the following descriptions and a study of the several figures of the drawing.

SUMMARY

Example embodiments of a multiphase ground fault circuit interrupter utilize a plurality of latching relays associated with a corresponding plurality of power line inputs to disconnect the power lines from a load when a ground-fault is detected. In a further embodiments, an additional latching relay is used to disconnect the neutral line from the load.

For example, a multiphase ground fault circuit interrupter includes a first phase power line input, a second phase power line input, a third phase power line input, a neutral line input, a controller circuit having a relay control output, a first phase latching relay having a first phase switch input coupled to the first phase power line input and a first phase relay control input coupled to the relay control output of the controller circuit, a sensor having a core and a sensor pickup coupled to the controller circuit, and a first phase load wire coupled to a first phase switch output of the first phase latching relay and passed through the core.

In a further example, a method for multiphase ground fault protection includes passing a plurality of power load wires and a neutral load wire through a sensor including a core and a sensor pickup, connecting the plurality of power load wires to a multiphase power source with a corresponding plurality of latching relays, detecting a ground fault between at least one of the plurality of power load wires and ground, and disconnecting the plurality of load wires from the power source by tripping the corresponding plurality of latching relays.

An advantage of using multiple latching relays rather than a contactor is that, once they are tripped, no power is required for the control circuitry to maintain an open state for the relay switches. Therefore, even if power is wholly lost or reduced (e.g. in a brown-out situation), the tripped relays will remain open until reset.

Another advantage of using multiple latching relays rather than a contactor is that the cumulative cost of the latching relays tends to be considerably less that than that of a single, high power contactor.

An advantage of using an additional latching relay to disconnect the neutral line from the load is that additional safety is provided in, for example, ground-neutral fault situations.

These and other embodiments, features and advantages will become apparent to those of skill in the art upon a reading of the following descriptions and a study of the several figures of the drawing.

BRIEF DESCRIPTION OF THE DRAWINGS

Several example embodiments will now be described with reference to the drawings, wherein like components are provided with like reference numerals. The example embodiments are intended to illustrate, but not to limit, the invention. The drawings include the following figures:

FIG. 5 is a flow diagram of an example relay test of FIG. 2; and

FIG. 6 is an illustration of an example method for multiphase ground fault protection.

DETAILED DESCRIPTION OF EXAMPLE EMBODIMENTS

Figure 1:
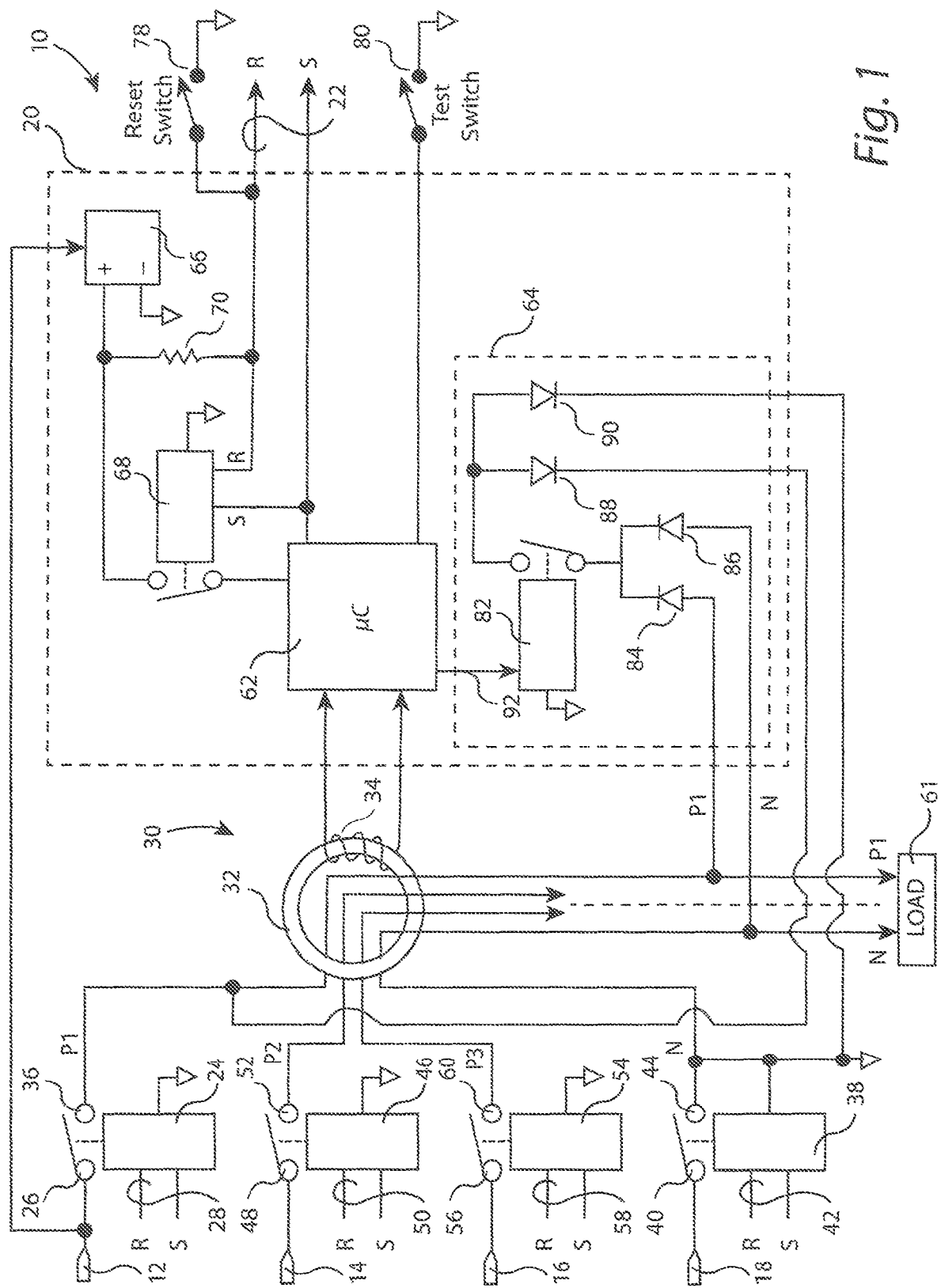
FIG. 1 is a block diagram of a multiphase ground fault circuit interrupter.

In FIG. 1, an example multiphase ground fault circuit interrupter 10 includes a first phase power line input 12, a second phase power line input 14, a third phase power line input 16, a neutral line input 18, a controller circuit 20 having a relay control output 22, a first phase latching relay 24 having a first phase switch input 26 coupled to the first phase power line input 12 and a first phase relay control input 28 coupled to the relay control output 22 of the controller circuit, a sensor 30 having a core 32 and a sensor pickup 34 coupled to the controller circuit 20, and a first phase load wire P1 coupled to a first phase switch output 36 of the first phase latching relay 24 and passed through the core 32. A neutral latching relay 38 has a neutral switch input 40 coupled to the neutral line input 18 and a neutral latching relay control input 42 coupled to the relay control output 22 of the controller circuit 20. A neutral load wire N is coupled to a neutral switch output 44 of the neutral line latching relay 38 and extends through the core 32.

In this example, multiphase ground fault circuit interrupter 10 further includes a second phase latching relay 46 having a second phase switch input 48 coupled to the second phase power line input 14 and a second phase relay control input 50 coupled to the relay control output 22 of the controller circuit 20. A second phase load wire P2 is coupled to a second phase switch output 52 of the second phase latching relay 46 and extends through the core 32.

With continuing reference to FIG. 1, in this example a third phase latching relay 54 having a third phase switch input 56 coupled to the third phase power line input 16 and a third phase relay control input 58 coupled to the relay control output 22 of the controller circuit 20. A third phase load wire P3 is coupled to a third phase switch output 60 of the third phase latching relay 54 and extends through the core 32.

The number of power lines extending through the core 32 depends upon the requirements of a load 61. For example, if load 61 only requires a single phase, only load wire P1 and neutral load wire N need to extend through the core 32. As another example, if the load 61 requires all three phases, load wires P1, P2, P3 and N all extend through the core 32. It will therefore be appreciated that the power provided to the load 61 can be one, two or three phases, in the present example.

The core 32 and sensor pickup 34 comprise an inductive current sensor which can detect current flowing on the wires that extend through the core. The core 32 is typically made from a high-nickel metal alloy and the sensor pickup comprises a number of winds of an insulated wire on the core surface. Inductive current sensors are well known to those of skill in the art. For example, in U.S. Pat. No. 6,566,855 of Nguyen et al., the disclosure of which is incorporated herein by reference, a device to measure current magnitude in a conductor coupled to an electrical device is disclosed.

It will be noted that in this example embodiment, the relay control output 22 and the relay control inputs 28, 42, 50 and 58 include separate Reset (R) and Set (S) lines carrying R and S signals, respectively. This is because the latching relays of this example will latch in a closed position in response to a reset signal on their R control inputs and will latch in an open position in response to a set signal on their S control inputs. In this example, suitable latching relays include the Power Latching Relay TOU80 series made by TE Connectivity, headquartered in Schaffhausen, Switzerland with worldwide offices. Other types of latching relays can also be used with other types of control inputs. For example, a latching relay with a single toggle control input can be used to toggle the latching relays between their open and closed positions.

More particularly, in this example, the relay control output of the controller circuit includes a Reset (R) output and a Set (S) output, the first phase relay control input includes an R input coupled to the R output and an S input coupled to the S output, and the neutral latching relay control input includes an R input coupled to the R output and an S input coupled to the S output, whereby the R output of the controller circuit resets both the first phase latching relay and the neutral latching relay, and the S output of the controller circuit set both the first phase latching relay and the neutral latching relay. Similarly, the R output of the controller circuit further resets the second phase latching relay and the third phase latching relay, and the S output of the controller circuit sets the second phase latching relay and the third phase latching relay.

The controller circuit 20 of this example includes a microcontroller (μC) 62, a sensor test circuit 64, an isolated alternating current to direct current (AC/DC) converter 66, a state relay 68, and a current limiting resistor 70. The microcontroller 62 is coupled to the sensor pickup 34 and is operative to develop the set signal S upon the detection of a ground fault. The microcontroller 62 can be, for example, an NCS37010 Self Test With Lockout Ground Fault Circuit Interrupter sold by onsemi of Phoenix, Ariz.

The AC/DC converter 66 converts the AC voltage on first phase power line input 12 to a relatively low DC voltage, e.g. in the range of 6-12 VDC. The state relay 68 is a latching relay, preferably of the same type latching relays 24, 46, 54, and 38, and is controlled by the same set (S) and reset (R) relay control signals. When the state relay 68 is in a reset (R) state, the relay switch is closed and the microcontroller 62 is powered. When the state relay is in a set (S) state, the relay switch is open, and power is removed from the microcontroller. In consequence, upon a detection of a ground fault, all of the latching relays are set to an open state, and the only device of the controller circuit that is powered is the AC/DC converter 66.

The multiphase ground fault circuit interrupter 10 is reset by activating a reset switch 78 to create the R signal, thereby resetting all of the latching relays and thereby repowering the system. A test switch 80 is also coupled to the microcontroller 62 to manually initiate a test of the system.

The sensor test circuit 64 includes a relay 82 and four diodes 84, 86, 88 and 90. The relay is activated by the microcontroller 62 via a relay control line 92 to initiate a test of the sensor 30. The relay 82 can be activated manually by test switch 80 or can be automatically activated on a periodic basis during operation by the microcontroller 62. Diode 84 is coupled to the P1 line on the load side of core 32, diode 86 is coupled to the N line on the load side of core 32, diode 88 is coupled to the P1 line on the power side of the core 32, and diode 90 is coupled to the N line on the power side of core 32. When the relay 82 is activated, the diodes 28, 26, 88, and 90 cause current to flow through the P1 line and the N line to simulate a ground fault condition. If the microcontroller 62 detects the simulated ground fault condition, the sensor 30 is operating properly. If the microcontroller 62 does not detect the simulated ground fault condition, the sensor is not working properly, and a set (S) signal is developed to trip the latching relays and remove power from the system.

Figure 2:
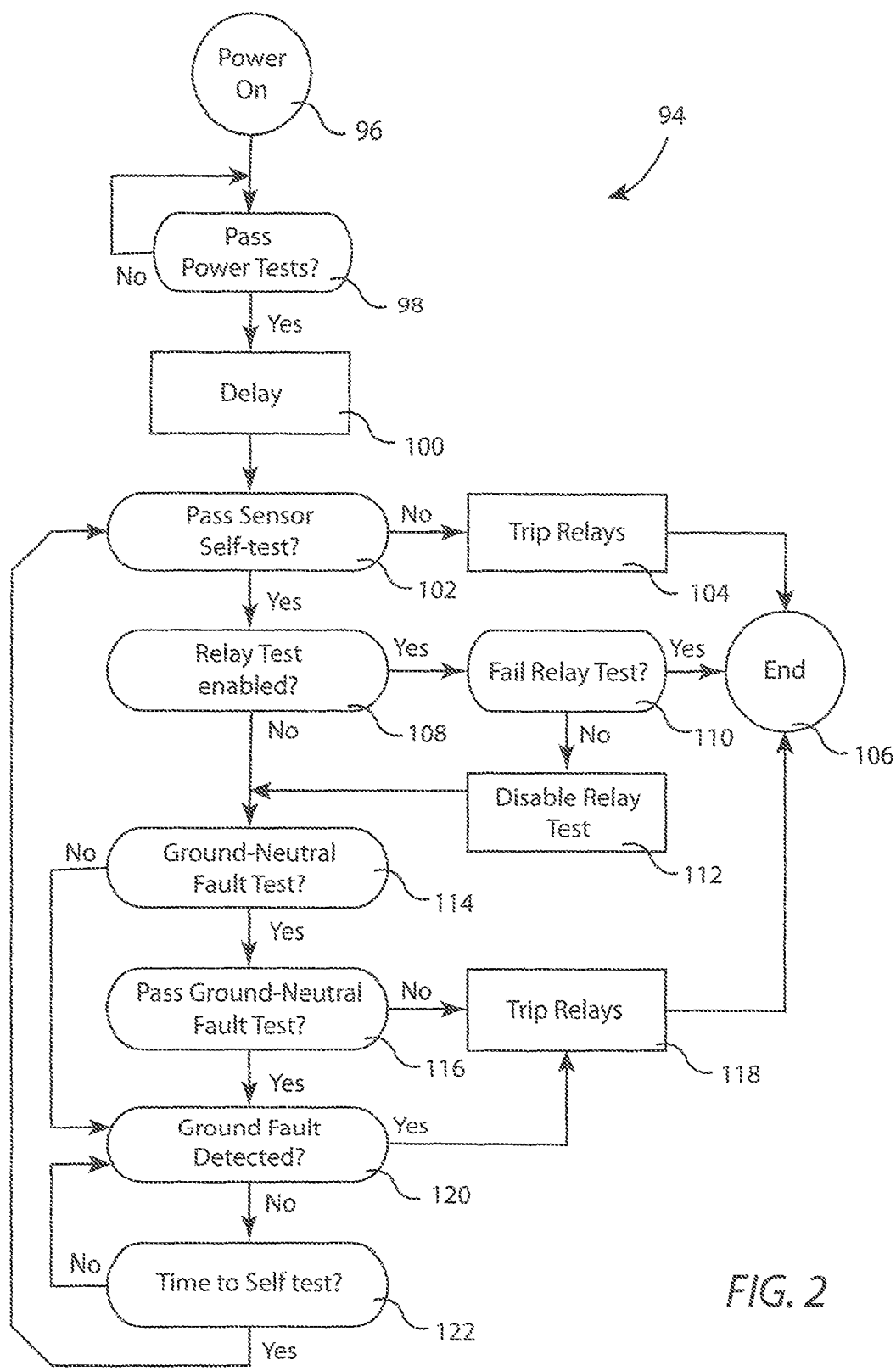
FIG. 2 is a flow diagram of an example process performed by the microcontroller (μC) of FIG. 1.

FIG. 2 is a flow diagram of an example process 94 performed by the microcontroller 62. Process 94 begins with a power-on 96 of the system, e.g. by either applying power to the system or resetting the system after a ground-fault has been cleared. Next, an operation 98 idles until the system passes initial power-up tests, after which the system is delayed in an operation 100 to allow the circuitry to settle. For example, operation 100 can provide a 60 ms delay. After the delay, an operation 102 determines if the sensor passes a self-test procedure. If not, the latching relays are tripped (e.g. by developing an S signal) to remove power from the system, and the process ends at 106. If the sensor self-test is successful, an operation 108 determines if a relay test is enabled. If so, an operation determines if the relay test had failed and, if so, the process again ends at 106. If operation 10 determines that the relay test was successful, an operation 112 disables the relay test so that it does not run again. That is, typically the relay test runs only once after power-up. Next, in an operation 114, it is determined if a ground-neutral fault test is enabled. If so, an operation 116 determines if the ground-fault test was successful. If not, an operation 118 trips the latching relays to remove power from the system and the process ends at 106. Next, an operation 120 determines if a ground fault is detected. If so, operation 118 again trips the latching relays and the process ends at 106. If no ground fault is detected by operation 120, an operation 122 determines if it is time to self-test the sensor. If not, operation 120 again tests for ground faults. If operation 122 determines that it is time to self-test the sensor, the process returns to operation 102. An example time between periodic, automatic self-tests is about 17 minutes, although shorter and longer periods can also be used as determined by a self-test timer, typically implemented by the microcontroller.

Figure 3:
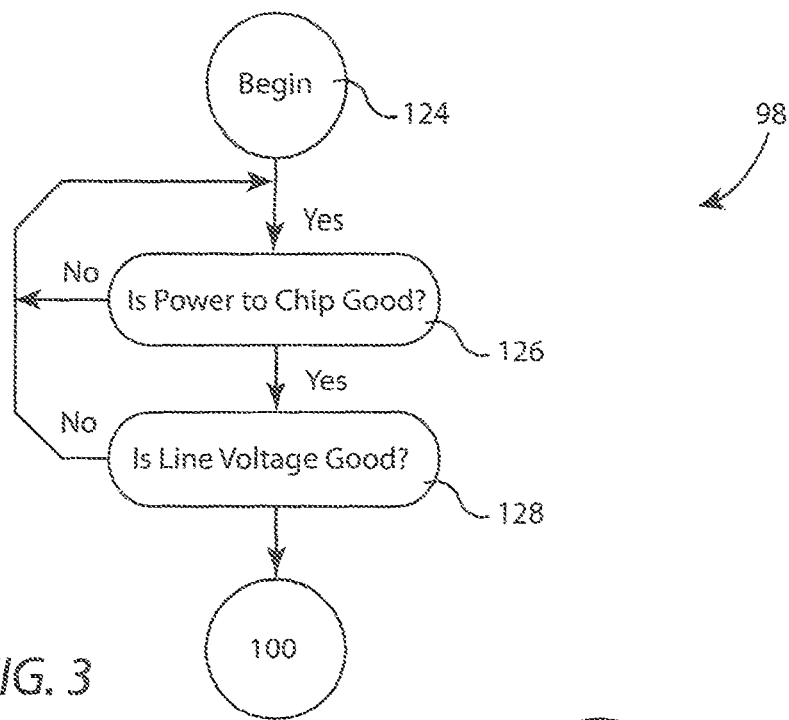
FIG. 3 is a flow diagram of an example power test of FIG. 2.

FIG. 3 is a flow diagram of an example power test process 98 of FIG. 2. The process begins at 124 and, in an operation 126, it is determined if the power to the microcontroller (chip) 62 is good. If not, operation 126 idles until the microcontroller chip 62 is properly powered. Next, in an operation 128, it is determined if the line voltage 12 is good. If not, the process returns to operation 126. If operation 128 determines that the line voltage is good, operation 100 of FIG. 2 proceeds to make the aforementioned delay.

Figure 4:
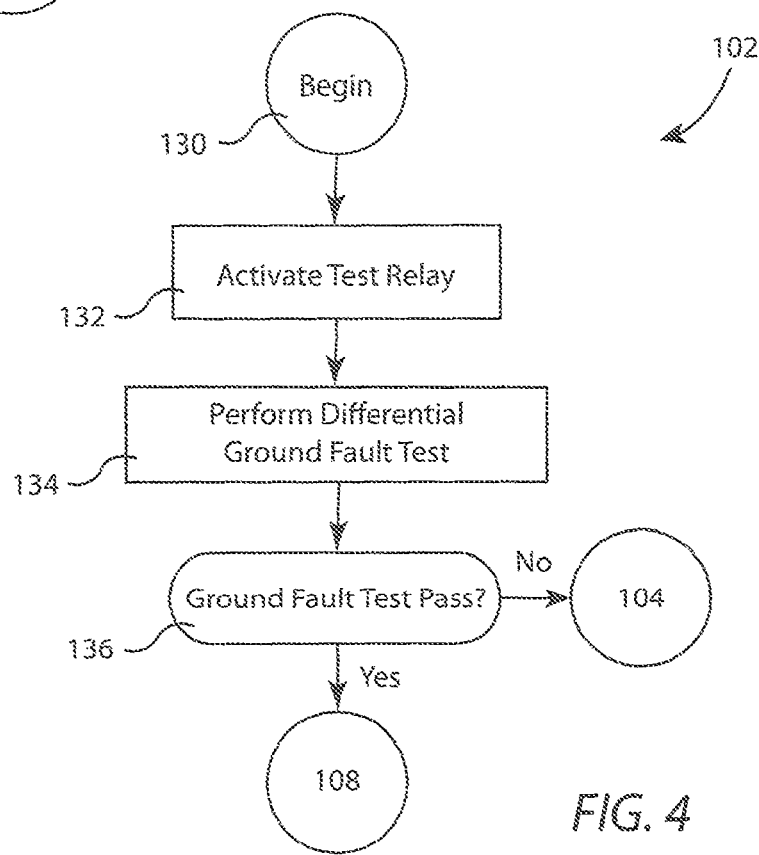
FIG. 4 is a flow diagram of an example self-test of FIG. 2.

FIG. 4 is a flow diagram of an example self-test process 102 of FIG. 2. The process begins at 130 and, in an operation 132, the microcontroller 62 activates the test relay 82. Next, in an operation 134, a differential ground fault test is performed on the lines P1 and N. If an operation 126 determines that the ground fault test did not pass, the process continues with operation 104 of FIG. 2, and if operation 126 determines that the ground fault test did pass, the process continues with operation 108 of FIG. 2.

FIG. 5 is a flow diagram of an example relay test process 110 of FIG. 2. The process begins at 138 and, in an operation 140, all of the latching relays are tripped (e.g. set or opened). Next, in an operation 142 it is determined if a load voltage is available on P1. If yes, the relay test has failed, and the process ends at 106 of FIG. 2. If no, the relay test was passed, and an operation 144 resets (e.g. closes) the latching relays and resets the self-test timer count to zero. Process control then returns to operation 112 of FIG. 2.

FIG. 6 is an illustration of an example method 146 for multiphase ground fault protection. The process 146 begins at 148 and, in an operation 150, a plurality of power load wires and a neutral load wire are passed through a sensor including a core and a sensor pickup. Next, in an operation 152, the plurality of power load wires are connected to a multiphase power source with a corresponding plurality of latching relays. An operation 154 detects a ground fault between at least one of the plurality of power load wires and ground, and the plurality of load wires are disconnected from the power source by tripping the corresponding plurality of latching relays in an operation 156. The process 146 then ends at 158.

Although various embodiments have been described using specific terms and devices, such description is for illustrative purposes only. The words used are words of description rather than of limitation. It is to be understood that changes and variations may be made by those of ordinary skill in the art without departing from the spirit or the scope of various inventions supported by the written disclosure and the drawings. In addition, it should be understood that aspects of various other embodiments may be interchanged either in whole or in part. It is therefore intended that the claims be interpreted in accordance with the true spirit and scope of the invention without limitation or estoppel.

What is claimed is:

1. A multiphase ground fault circuit interrupter comprising:
 a first phase power line input;
 a second phase power line input;
 a third phase power line input;
 a neutral line input;
 a controller circuit having a relay control output;
 a first phase latching relay having a first phase switch input coupled to the first phase power line input and a first phase relay control input coupled to the relay control output of the controller circuit;
 a second phase latching relay having a second phase switch input coupled to the second phase power line input and a second phase relay control input coupled to the relay control output of the controller circuit;
 a third phase latching relay having a third phase switch input coupled to the third phase power line input and a third phase relay control input coupled to the relay control output of the controller circuit;
 a sensor having a core and a sensor pickup coupled to the controller circuit;
 a first phase load wire coupled to a first phase switch output of the first phase latching relay and extending through the core;
 a second phase load wire coupled to a second phase switch output of the second phase latching relay and extending through the core; and
 a third phase load wire coupled to a third phase switch output of the third phase latching relay and extending through the core.

2. A multiphase ground fault circuit interrupter as recited in claim 1 further comprising a neutral latching relay having a neutral switch input coupled to the neutral line input and a neutral latching relay control input coupled to the relay control output of the controller circuit.

3. A multiphase ground fault circuit interrupter as recited in claim 2 further comprising a neutral load wire coupled to a neutral switch output of the neutral line latching relay and extending through the core.

4. A multiphase ground fault circuit interrupter comprising:
 a first phase power line input;
 a second phase power line input;
 a third phase power line input;
 a neutral line input;
 a controller circuit having a relay control output;
 a first phase latching relay having a first phase switch input coupled to the first phase power line input and a first phase relay control input coupled to the relay control output of the controller circuit;

a sensor having a core and a sensor pickup coupled to the controller circuit;

a first phase load wire coupled to a first phase switch output of the first phase latching relay and extending through the core;

a neutral latching relay having a neutral switch input coupled to the neutral line input and a neutral latching relay control input coupled to the relay control output of the controller circuit; and a neutral load wire coupled to a neutral switch output of the neutral line latching relay and extending through the core;

wherein the relay control output of the controller circuit includes a Reset (R) output and a Set (S) output, the first phase relay control input includes an R input coupled to the R output and an S input coupled to the S output, and the neutral latching relay control input includes an R input coupled to the R output and an S input coupled to the S output, whereby the R output of the controller circuit resets both the first phase latching relay and the neutral latching relay, and the S output of the controller circuit set both the first phase latching relay and the neutral latching relay.

5. A multiphase ground fault circuit interrupter as recited in claim 4 wherein the R output of the controller circuit further resets a second phase latching relay and a third phase latching relay, and the S output sets the second phase latching relay and the third phase latching relay.

6. A multiphase ground fault circuit interrupter as recited in claim 5 wherein the controller circuit includes a microcontroller coupled to the sensor pickup and operative to develop an S output.

7. A multiphase ground fault circuit interrupter as recited in claim 6 wherein the controller circuit further includes an analog current (AC) to direct current (DC) converter having an AC input coupled to the first phase power line input.

8. A multiphase ground fault circuit interrupter as recited in claim 7 wherein the controller circuit further comprises a state relay having a state relay control input, the state relay selectively coupling a DC output of the AC to DC converter to the microcontroller.

9. A multiphase ground fault circuit interrupter as recited in claim 8 wherein the state relay control input includes a state relay set input and a state relay reset input.

10. A multiphase ground fault circuit interrupter as recited in claim 9 wherein the controller circuit further comprises a sensor test circuit coupled between the first phase load wire before the core and the first phase load wire after the core and between a neutral switch wire before the core and the neutral load wire after the core.

11. A multiphase ground fault circuit interrupter as recited in claim 10 wherein the controller circuit further includes a test relay having a test relay control input coupled to the microcontroller for selectively enabling the sensor test circuit.

12. A method for multiphase ground fault protection comprising:

coupling a first phase power line to a first phase load wire with a first phase latching relay, wherein the first phase load wire extends through a core having a sensor pickup coupled to a controller circuit having a relay control output, wherein the first phase latching relay includes a first phase switch input coupled to a first phase power line input, a first phase switch output coupled to the first phase load wire, and a first phase relay control input coupled to the relay control output of the controller circuit;

coupling a second phase power line to a second phase load wire with a second phase latching relay, wherein the second phase load wire extends through the core and wherein the second phase latching relay includes a second phase switch input coupled to a second phase power line input, a second phase switch output coupled to the second phase load wire, and a second phase relay control input coupled to the relay control output of the controller circuit;

coupling a third phase power line to a third phase load wire with a third phase latching relay, wherein the third phase load wire extends through the core and wherein the third phase latching relay includes a third phase switch input coupled to a third phase power line input, a third phase switch output coupled to the third phase load wire, and a third phase relay control input coupled to the relay control output of the controller circuit, detecting a ground fault between at least one of the first phase load wire, the second phase load wire, and the third phase load wire and ground; and disconnecting the first phase load wire, the second phase load wire, and the third phase load wire from the first phase power line input, the second phase power line input, and the third phase power line input by tripping the first phase latching relay, the second phase latching relay and the third phase latching relay.

13. A method for multiphase ground fault protection as recited in claim 12 further comprising coupling a neutral line to a neutral load wire with a neutral latching relay, wherein the neutral load wire extends through the core and wherein the neutral latching relay includes a neutral switch input coupled to a neutral line input, a neutral switch output coupled to the neutral load wire, and a neutral relay control input coupled to the relay control output of the controller circuit.

14. A method for multiphase ground fault protection as recited in claim 13 further comprising periodically testing the sensor.

15. A method for multiphase ground fault protection as recited in claim 14 further comprising testing the first phase latching relay, the second phase latching relay, the third phase latching relay and the neutral latching relay.

16. A method for multiphase ground fault protection as recited in claim 15 further comprising testing for a ground-neutral fault between the neutral load wire and ground.

* * * * *